(12) United States Patent
Wang et al.

(10) Patent No.: US 7,129,877 B2
(45) Date of Patent: Oct. 31, 2006

(54) DIGITAL-TO-ANALOG CONVERTER WITH SWITCHED CAPACITOR NETWORK

(75) Inventors: Haisong Wang, Tokyo (JP); Atsushi Hirama, Tokyo (JP); Toshio Teraishi, Tokyo (JP); Takashi Honda, Tokyo (JP); Shiming Lan, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/113,243

(22) Filed: Apr. 25, 2005

(65) Prior Publication Data

US 2005/0285767 A1 Dec. 29, 2005

(30) Foreign Application Priority Data

Jun. 29, 2004 (JP) .............................. 2004-190817

(51) Int. Cl.
*H03M 1/66* (2006.01)
(52) U.S. Cl. ........................ 341/150; 341/172; 341/144
(58) Field of Classification Search ................ 341/144, 341/154, 172, 120, 148, 145, 155
See application file for complete search history.

(56) References Cited

U.S. PATENT DOCUMENTS

| | | | | |
|---|---|---|---|---|
| 5,079,552 | A * | 1/1992 | Pelgrom et al. ............. | 341/148 |
| 5,376,936 | A * | 12/1994 | Kerth et al. ................. | 341/150 |
| 5,831,566 | A * | 11/1998 | Ginetti ........................ | 341/144 |
| 5,841,382 | A * | 11/1998 | Walden et al. .............. | 341/120 |
| 6,201,491 | B1 * | 3/2001 | Brunolli et al. ............. | 341/144 |
| 6,249,239 | B1 * | 6/2001 | Corkum ....................... | 341/154 |
| 6,268,813 | B1 * | 7/2001 | de Wit ......................... | 341/120 |
| 6,373,419 | B1 | 4/2002 | Nakao | |
| 6,384,762 | B1 * | 5/2002 | Brunolli et al. ............. | 341/144 |
| 6,469,647 | B1 * | 10/2002 | Kinugasa et al. ........... | 341/145 |
| 6,486,806 | B1 * | 11/2002 | Munoz et al. ............... | 341/120 |
| 6,567,026 | B1 * | 5/2003 | Gorman ....................... | 341/154 |
| 6,570,520 | B1 * | 5/2003 | Ishii ............................. | 341/144 |
| 6,617,989 | B1 * | 9/2003 | Deak ........................... | 341/144 |
| 6,642,877 | B1 * | 11/2003 | Leung ......................... | 341/144 |
| 6,724,336 | B1 * | 4/2004 | Leung et al. ................ | 341/145 |
| 6,836,236 | B1 * | 12/2004 | Horie .......................... | 341/155 |
| 6,882,298 | B1 * | 4/2005 | Leung et al. ................ | 341/172 |
| 6,924,760 | B1 * | 8/2005 | McLeod et al. ............ | 341/144 |
| 6,956,520 | B1 * | 10/2005 | Leung et al. ................ | 341/172 |

FOREIGN PATENT DOCUMENTS

JP 2000-183747 6/2000

* cited by examiner

*Primary Examiner*—Jean Bruner Jeanglaude
(74) *Attorney, Agent, or Firm*—Nixon Peabody LLP; Donald R. Studebaker (57) ABSTRACT

A digital-to-analog converter generates a monotonic sequence of reference voltages and selects an arbitrary pair of reference voltages, adjacent in the monotonic sequence, according to digital input. A switching network charges a capacitor according to the difference between the two selected reference voltages, then connects another capacitor to the first capacitor to generate a voltage intermediate between the two selected reference voltages by redistributing charge between the capacitors. The switching network also selects one of the selected reference voltages or the intermediate voltage as the analog output voltage. This conversion scheme saves space with little or no increase in current consumption.

26 Claims, 6 Drawing Sheets

DIGITAL-TO-ANALOG CONVERTER WITH SWITCHED CAPACITOR NETWORK

BACKGROUND OF THE INVENTION

1. Field of the Invention

The present invention relates to a digital-to-analog converter useful in, for example, a circuit that drives a liquid crystal display.

2. Description of the Related Art

With the recent increase in the size of liquid crystal display devices, various needs have arisen for improved performance in their driving circuits. One need is for a gradation scale with more gradation levels, especially for the display of more vivid colors. The current state of the art is a liquid crystal display device that can reproduce over one billion different colors by using ten bits of data (1024 gradation levels) for each of the three primaries (red, green, blue). The increased number of gradation levels demands improved performance from the digital-to-analog (D/A) converters that convert digital signals received from an outside source to analog signals. D/A converters of the resistor string type are often employed.

Figure 8:
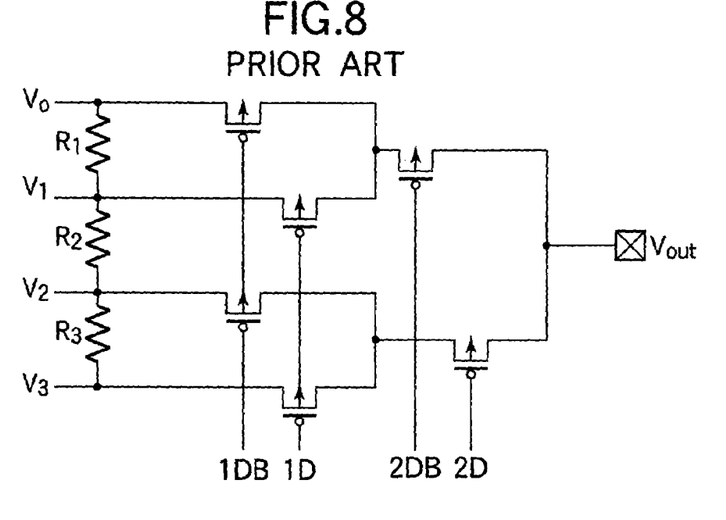
FIG. 8 is a circuit diagram of a conventional two-bit D/A converter.
Figure 9:
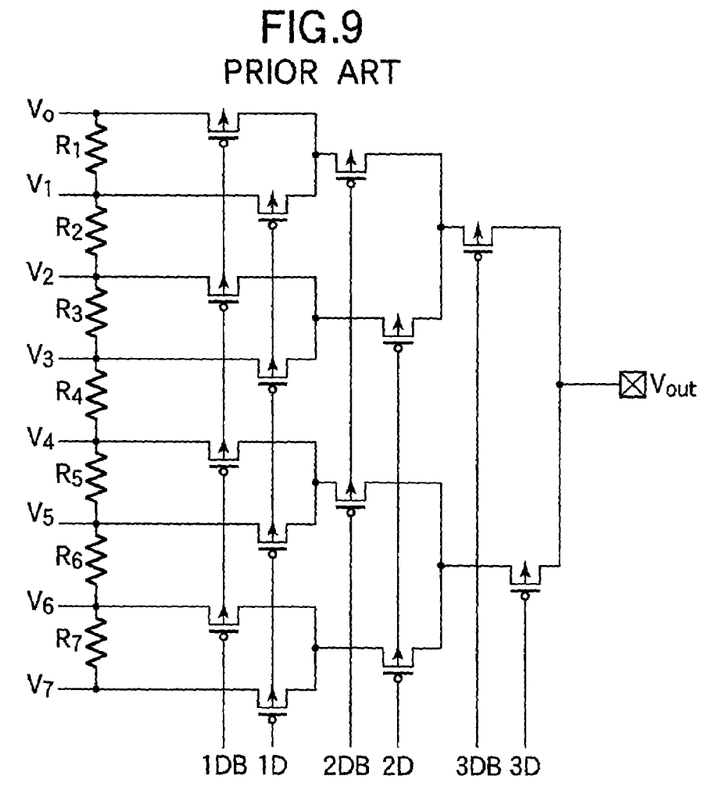
FIG. 9 is a circuit diagram of a conventional three-bit D/A converter.

The simplest resistor string D/A converters have the structure shown in FIG. 8, which converts two-bit digital data (bits 1D and 2D and their complementary values 1DB and 2DB), and FIG. 9, which converts three-bit digital data (bits 1D–3D and their complementary values 1DB–3DB). An output decoder comprising transistor switches selects one of the voltage levels ($V_0$, $V_1$, $V_2$, ...) generated by the resistor string ($R_1$, $R_2$, ...) for output ($V_{out}$). With this circuit configuration, each time the number of bits increases by one, the number of resistors and transistors substantially doubles, doubling the circuit area.

Japanese Patent Application Publication No. 2000-183747 (U.S. Pat. No. 6,373,419) describes an alternative circuit configuration with fewer resistors and transistors, but the output decoder requires an averaging voltage-follower amplifier with two parallel differential input stages, an arrangement that consumes an undesirably large amount of current.

SUMMARY OF THE INVENTION

An object of the present invention is to provide a D/A converter that has a reduced number of circuit elements, does not take up a large amount of space, and does not consume excessive current.

The invented D/A converter includes a voltage generator that generates a plurality of reference voltages forming a monotonic sequence of voltage levels. A first control circuit and a second control circuit select two of the reference voltages, mutually adjacent in the monotonic sequence, as a first output and a second output. A third control circuit has a plurality of capacitors and a switching network for charging at least one of the capacitors to a voltage difference between the first output and the second output, then redistributing charge among the capacitors to generate a voltage intermediate between the first and second outputs, and selectively supplying the first or second output or the intermediate voltage as the final analog output.

Compared with the simplest conventional type of resistor string D/A converter, the invented D/A converter takes up less space because it requires fewer circuit elements. The invented D/A converter also consumes less current than a D/A converter requiring a voltage follower amplifier with parallel input stages. To achieve further reductions in space and current consumption, the gate capacitances of metal-oxide-semiconductor transistors may be used as some or all of the capacitors.

DETAILED DESCRIPTION OF THE INVENTION

Embodiments of the invention will now be described with reference to the attached drawings, in which like elements are indicated by like reference characters. For convenience, the same symbols will be used to represent capacitors and their capacitance values.

First Embodiment

Figure 1:
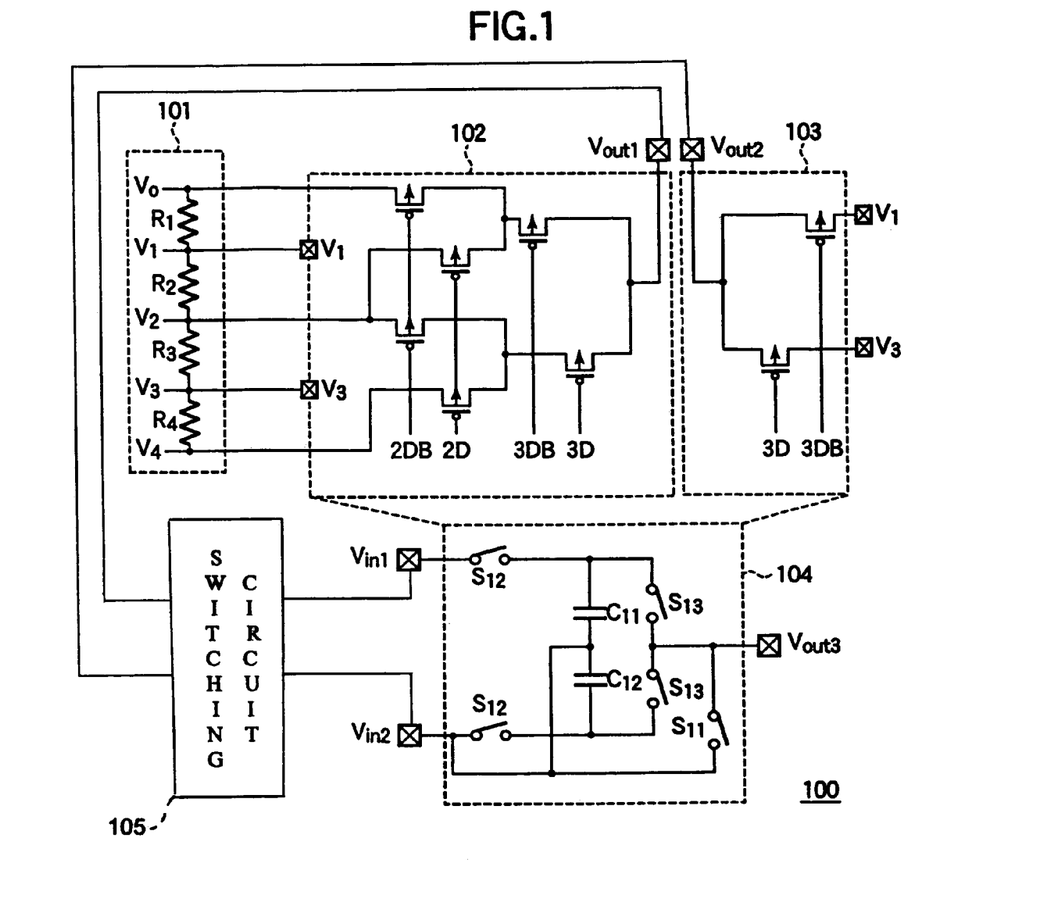
FIG. 1 is a circuit diagram of a D/A converter illustrating a first embodiment of the present invention.

The first embodiment is a D/A converter that converts n-bit digital data to an analog signal. Referring to FIG. 1, the D/A converter 100 comprises a voltage generator 101 and three control circuits 102, 103, 104. The illustrated circuit converts three-bit digital data comprising bits 1D, 2D, 3D and their complementary values 1DB, 2DB, 3DB.

The voltage generator 101 is a string of resistors ($R_0$, $R_1$, $R_2$, $R_3$) connected in series, receiving a voltage $V_0$ from a power source (not shown) and generating successively lower voltages ($V_1$ to $V_4$) by resistive voltage drops. Voltages $V_0$ to $V_4$ will be referred to below as reference voltages. In general, if n is the number of bits of digital input data, the voltage generator 101 in the first embodiment has $2^{n-1}$ resistors generating $2^{n-1}+1$ reference voltages.

The first control circuit 102 uses the upper two bits of input data (2D, 3D and their complementary values 2DB and 3DB) to select one of the even-numbered reference voltages ($V_0$, $V_2$, or $V_4$) as a first output $V_{out1}$. In general, the upper n−1 bits of input data are used to select an even-numbered one of the $2^{n-1}+1$ reference voltages generated by the voltage generator 101.

The second control circuit 103 uses the most significant bit (3D and its complementary value 3DB) to select an odd-numbered reference voltage ($V_1$ or $V_3$) adjacent to the even-numbered reference voltage selected by the first control circuit 102, and outputs it as a second output $V_{out2}$. In general, the upper n−2 bits are used to select an odd-numbered one of the $2^{n-1}+1$ reference voltages generated by the voltage generator 101.

The first control circuit 102 and second control circuit 103 may be any types of control circuits that can select two mutually adjacent reference voltages. They are not limited to the circuit configurations shown in FIG. 1.

The first and second outputs $V_{out1}$, $V_{out2}$ are supplied as first and second inputs $V_{in1}$, $V_{in2}$ through a switching circuit 105 to the third control circuit 104, which generates a third output $V_{out3}$. The third control circuit 104 comprises first and second capacitors $C_{11}$, $C_{12}$ and five switches. The first switch $S_{11}$ is connected between the second input $V_{in2}$ and third output $V_{out3}$. A pair of second switches $S_{12}$ are connected between the first input $V_{in1}$ and first capacitor $C_{11}$ and between the second input $V_{in2}$ and second capacitor $C_{12}$. A pair of third switches $S_{13}$ are connected between the first capacitor $C_{11}$ and the third output $V_{out3}$ and between the second capacitor $C_{12}$ and the third output $V_{out3}$. The first and second capacitors $C_{11}$, $C_{12}$ are connected in series between a node disposed between one pair of second and third switches $S_{12}$, $S_{13}$ and a node disposed between the other pair of second and third switches $S_{12}$, $S_{13}$, and have a common node connected to the second input $V_{in2}$.

The switches $S_{11}$, $S_{12}$, and $S_{13}$ are controlled by the least significant bit of the digital input data (1D and its complementary value 1DB, not shown). The first and second capacitors $C_{11}$, $C_{12}$ have identical capacitance values.

Here and in the descriptions of the following embodiments, the term 'identical' means that the two capacitance values are the same to within a tolerance that allows for normal fabrication process variations. As the number of reference voltages increases, the voltage difference between the first and second outputs $V_{out1}$ and $V_{out2}$ decreases, so the error caused by process variations can be tolerated.

Figure 2:
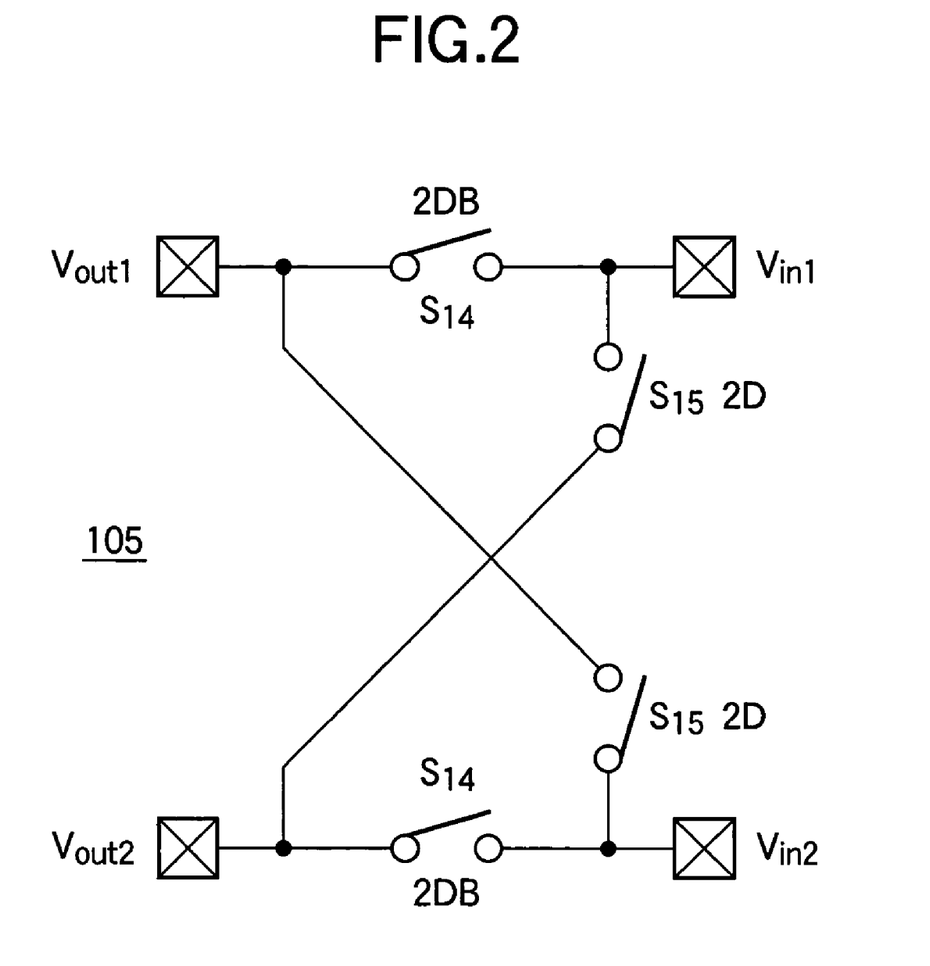
FIG. 2 is a circuit diagram of the switching circuit in FIG. 1.

Referring to FIG. 2, the switching circuit 105 has first and second input terminals that receive the outputs $V_{out1}$ and $V_{out2}$ from the first and second control circuits 102, 103; first and second output terminals that supply the first and second input voltages $V_{in1}$ and $V_{in2}$ to the third control circuit 104; and switches $S_{14}$, $S_{15}$ that can connect either input terminal to either output terminal. The switches $S_{14}$, $S_{15}$ are controlled by the second least significant bit (2D and its complementary value 2DB) of the digital input signal.

The switches $S_{11}$, $S_{12}$, $S_{13}$, $S_{14}$ and $S_{15}$ in the third control circuit 104 and switching circuit switching circuit 105 are analog switches comprising metal-oxide-semiconductor (MOS) transistors (not shown).

Next the operation of the first embodiment will be described.

The first control circuit 102 selects an even-numbered reference voltage as the first output voltage $V_{out1}$, according to digital input data 2D, 2DB, 3D, and 3DB. The second control circuit 103 selects an odd-numbered reference voltage as the second output voltage $V_{out2}$, according to digital input data 3D and 3DB. The first control circuit 102 and second control circuit 103 are configured so as to assure that the selected first and second outputs $V_{out1}$, $V_{out2}$ are mutually adjacent in the series of reference voltages generated by the voltage generator 101.

When the least significant bit of the input data is zero (1D=0), the first switch $S_{11}$ in the third control circuit 104 is turned on, the second and third switches $S_{12}$, $S_{13}$ are turned off, and the second input $V_{in2}$ is output as the third output $V_{out3}$. When the least significant bit of the input data is one (1D=1), the first and third switches $S_{11}$, $S_{13}$ are turned off and the second switch $S_{12}$ is turned on, connecting the first capacitor $C_{11}$ to the first input $V_{in1}$ so that it is charged to ($V_{in1}$−$V_{in2}$) while the second capacitor $C_{12}$ is discharged to zero volts. After a time sufficient for the capacitors to charge and discharge, the second switches $S_{12}$ are turned off and the third switches $S_{13}$ are turned on. Due to the equal capacitance of the two capacitors, half of the charge stored in the first capacitor $C_{11}$ is redistributed to the second capacitor $C_{12}$. Both capacitors now store a charge equal to ($V_{in1}$−$V_{in2}$)/2, and a voltage halfway between the first and second inputs $V_{in1}$, $V_{in2}$ is output through the third switches $S_{13}$ as the third output $V_{out3}$.

When the middle bit of the input data is zero (2D=0), switches $S_{14}$ are turned on and switches $S_{15}$ are turned off in the switching circuit 105, connecting the first output $V_{out1}$ to the first input $V_{in1}$ and the second output $V_{out2}$ to the second input $V_{in2}$. When the middle bit of the input data is one (2D=1), switches $S_{14}$ are turned off and switches $S_{15}$ are turned on, connecting the first output $V_{out1}$ to the second input $V_{in2}$ and the second output $V_{out2}$ to the first input $V_{in1}$. This switchover causes the third output $V_{out3}$ to increase monotonically from $V_4$ to ($V_0$+$V_1$)/2 as the digital input increases from '000' to '111', as shown in Table 1.

TABLE 1

| Input | $V_{out1}$ | $V_{out2}$ | $V_{out3}$ |
|---|---|---|---|
| 111 | $V_0$ | $V_1$ | ($V_0$ + $V_1$)/2 |
| 110 | $V_0$ | $V_1$ | $V_1$ |
| 101 | $V_2$ | $V_1$ | ($V_1$ + $V_2$)/2 |
| 100 | $V_2$ | $V_1$ | $V_2$ |
| 011 | $V_2$ | $V_3$ | ($V_2$ + $V_3$)/2 |
| 010 | $V_2$ | $V_3$ | $V_3$ |
| 001 | $V_4$ | $V_3$ | ($V_3$ + $V_4$)/2 |
| 000 | $V_4$ | $V_3$ | $V_4$ |

As Table 1 shows, the first embodiment produces the same number of output voltage gradations as the conventional D/A converter shown in FIG. 9, using a resistor string with only about half as many resistors. More precisely, the first embodiment requires a string of $2^{n-1}$ resistors, as noted above, whereas the conventional circuits shown in FIGS. 8 and 9 require a string of $2^n$−1 resistors.

When the first embodiment is adapted to convert n-bit input data (n>3), the first and second control circuits 102, 103 require additional transistors, but the switching circuit 105 and third control circuit 104 do not. For large numbers of bits (n=10, for example), the first embodiment requires far fewer circuit elements in all than a conventional D/A converter of the type shown in FIGS. 8 and 9, the difference increasing as the number of bits increases.

In addition, since the third control circuit 104 consumes power only when the first and second capacitors $C_{11}$, $C_{12}$ charge and discharge, it adds only slightly to the total power consumption. In particular, if the least significant data bit 1D is zero, then once switches $S_{12}$ are switched off, there is no flow of current from the voltage generator 101 into the control circuits 102, 103, 104.

Second Embodiment

The second embodiment is a modification of the first embodiment that operates as an (n+1)-bit D/A converter. In the example shown in FIG. 3, the second embodiment is a four-bit D/A converter receiving digital data bits 1D, 2D, 3D, 4D, and their complementary values 1DB, 2DB, 3DB, 4DB. The second embodiment has the same voltage generator 101, first control circuit 102, second control circuit 103, and switching circuit 105 as the first embodiment, but has a modified third control circuit 204, which will be described below.

Figure 3:
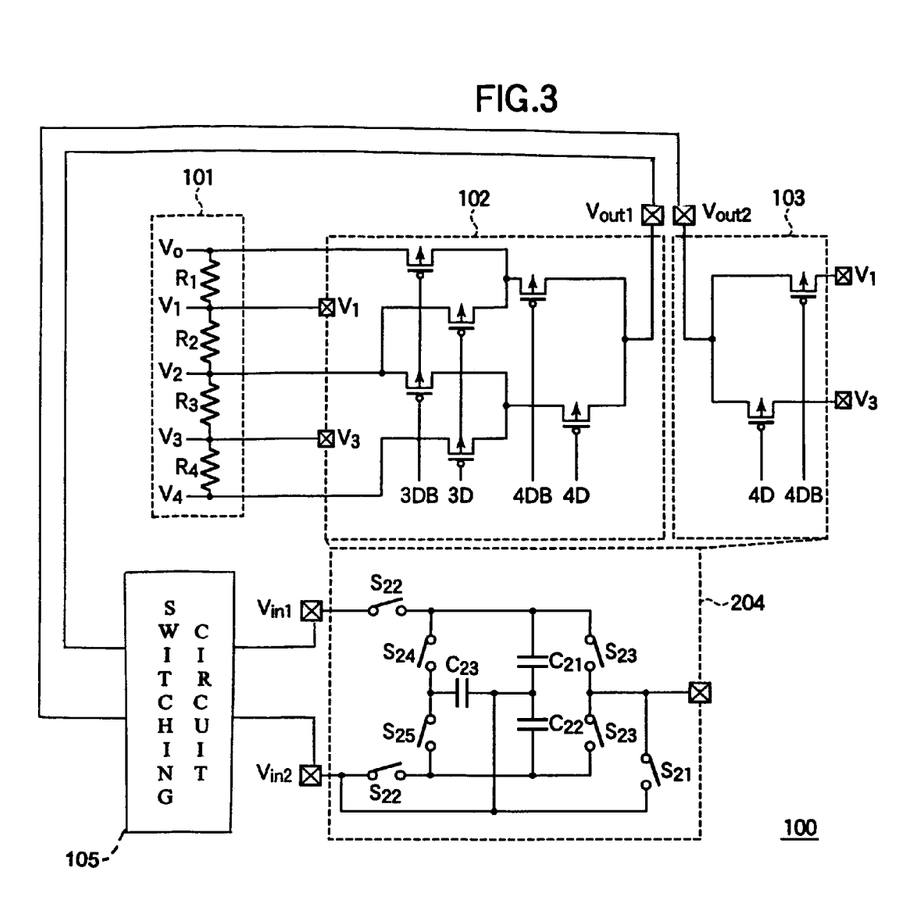
FIG. 3 is a circuit diagram of a D/A converter illustrating a second embodiment of the invention.

The third control circuit 204 comprises switches $S_{21}$, $S_{22}$, $S_{23}$ and capacitors $C_{21}$, $C_{22}$ identical to the corresponding switches $S_{11}$, $S_{12}$, $S_{13}$ and capacitors $C_{11}$, $C_{12}$ in the first embodiment and interconnected in the same way. In addition, the third control circuit 204 of the second embodiment has a third capacitor $C_{23}$ with a terminal connected to the node at which the first and second capacitors $C_{21}$, $C_{22}$ are interconnected, so that all three capacitors $C_{21}$, $C_{22}$, $C_{23}$ have one terminal connected to the second input $V_{in2}$. The other terminal of the third capacitor $C_{23}$ is connected through a fourth switch $S_{24}$ to the other terminal of the first capacitor $C_{21}$, and through a fifth switch $S_{25}$ to the other terminal of the second capacitor $C_{22}$.

In the third control circuit 204 of the second embodiment, the first and second capacitors $C_{21}$, $C_{22}$ have mutually identical capacitances, the third capacitor $C_{23}$ has twice the capacitance of the first capacitor $C_{21}$, and switches $S_{21}$, $S_{22}$, $S_{23}$, and $S_{24}$ are controlled by the two least significant bits (1D and 2D and their complementary values 1DB and 2DB). The switches $S_{14}$ and $S_{15}$ in the switching circuit 105 are controlled by the third least significant bit (3D and its complementary value 3DB).

The operation of the second embodiment will now be described.

When 2D=0 and 1D=0, only the first switch $S_{21}$ is turned on and all the other switches are turned off, so the second input $V_{in2}$ is output directly as the third output $V_{out3}$.

When 2D=0 and 1D=1, first the second and fifth switches $S_{22}$ and $S_{25}$ are turned on and all the other switches are turned off, connecting the first capacitor $C_{21}$ to the first input $V_{in1}$ so that it is charged to ($V_{in1}-V_{in2}$) while the second and third capacitors $C_{22}$ and $C_{23}$ are discharged to zero volts. After a time sufficient for capacitor $C_{21}$ to charge, the second switches $S_{22}$ are turned off and the third and fourth switches $S_{23}$ and $S_{24}$ are turned on instead, connecting the first, second, and third capacitors $C_{21}$, $C_{22}$, and $C_{23}$ in parallel with one another so that the charge stored in the first capacitor $C_{21}$, i.e., $C_{21}(V_{in1}-V_{in2})$, is shared by these three capacitors. Since $C_{21}=C_{22}$ and $C_{23}=2C_{21}$ as noted above, the third output $V_{out3}$ can be calculated according to the law of conservation of charge as follows:

$$V_{out3}=V_{in2}+(\tfrac{1}{4})(V_{in1}-V_{in2}).$$

The third output $V_{out3}$ is therefore higher than the second input $V_{in2}$ by one quarter of the voltage difference between the first and second inputs $V_{in1}$, $V_{in2}$.

When 2D=1 and 1D=0, first the second switches $S_{22}$ are turned on and all the other switches are turned off, connecting the first capacitor $C_{21}$ to the first input $V_{in1}$ so that it is charged to ($V_{in1}-V_{in2}$) while the second capacitor $C_{22}$ is discharged to zero volts. After a time sufficient for the first capacitor $C_{21}$ to charge, the second switches $S_{22}$ are turned off and the third switches $S_{23}$ are turned on instead, connecting the first and second capacitors $C_{21}$, $C_{22}$ in parallel with each other so that the charge stored in the first capacitor $C_{21}$ is redistributed between them. Since $C_{21}=C_{22}$, the third output $V_{out3}$ can be calculated according to the law of conservation of charge as follows:

$$V_{out3}=V_{in2}+(\tfrac{1}{2})(V_{in1}-V_{in2}).$$

The third output $V_{out3}$ is therefore higher than the second input $V_{in2}$ by one half of the voltage difference between the first and second inputs $V_{in1}$, $V_{in2}$.

Finally, when 2D=1 and 1D=1, first the second and fourth switches $S_{22}$, $S_{24}$ are turned on and all the other switches are turned off, connecting the first and third capacitors $C_{21}$ and $C_{23}$ to the first input $V_{in1}$ so that they are charged to ($V_{in1}-V_{in2}$) while the second capacitor $C_{22}$ is discharged to zero volts. After a time sufficient for the first and third capacitors $C_{21}$ and $C_{23}$ to charge, the second switches $S_{22}$ are turned off, the fourth switch $S_{24}$ is left turned on, and the third and fifth switches $S_{23}$ and $S_{25}$ are turned on, connecting the first, second, and third capacitors $C_{21}$, $C_{22}$, and $C_{23}$ in parallel with one another so that the charge stored in the first and third capacitors $C_{21}$, $C_{23}$, i.e., $(C_{21}+C_{23})(V_{in1}-V_{in2})$, is shared by these three capacitors. Since $C_{21}=C_{22}$ and $C_{23}=2C_{21}$, the third output $V_{out3}$ can be calculated according to the law of conservation of charge as follows:

$$V_{out3}=V_{in2}+(\tfrac{3}{4})(V_{in1}-V_{in2}).$$

The third output $V_{out3}$ is therefore higher than the second input $V_{in2}$ by three-quarters of the voltage difference between the first and second inputs $V_{in1}$, $V_{in2}$.

In summary, the output voltages $V_{out1}$, $V_{out2}$, $V_{out3}$ have the values shown in Table 2.

TABLE 2

| Input | $V_{out1}$ | $V_{out2}$ | $V_{out3}$ |
|---|---|---|---|
| 1111 | $V_0$ | $V_1$ | $V_1 + (3/4)(V_0 - V_1)$ |
| 1110 | $V_0$ | $V_1$ | $V_1 + (1/2)(V_0 - V_1)$ |
| 1101 | $V_0$ | $V_1$ | $V_1 + (1/4)(V_0 - V_1)$ |
| 1100 | $V_0$ | $V_1$ | $V_1$ |
| 1011 | $V_2$ | $V_1$ | $V_2 + (3/4)(V_1 - V_2)$ |
| 1010 | $V_2$ | $V_1$ | $V_2 + (1/2)(V_1 - V_2)$ |
| 1001 | $V_2$ | $V_1$ | $V_2 + (1/4)(V_1 - V_2)$ |
| 1000 | $V_2$ | $V_1$ | $V_2$ |
| 0111 | $V_2$ | $V_3$ | $V_3 + (3/4)(V_2 - V_3)$ |
| 0110 | $V_2$ | $V_3$ | $V_3 + (1/2)(V_2 - V_3)$ |
| 0101 | $V_2$ | $V_3$ | $V_3 + (1/4)(V_2 - V_3)$ |
| 0100 | $V_2$ | $V_3$ | $V_3$ |
| 0010 | $V_4$ | $V_3$ | $V_4 + (3/4)(V_3 - V_4)$ |
| 0011 | $V_4$ | $V_3$ | $V_4 + (1/2)(V_3 - V_4)$ |
| 0001 | $V_4$ | $V_3$ | $V_4 + (1/4)(V_3 - V_4)$ |
| 0000 | $V_4$ | $V_3$ | $V_4$ |

Controlling the third control circuit 204 by the lower two bits of the digital input data 2D and 1D makes it possible to generate three additional voltage levels from the first and second inputs $V_{in1}$ and $V_{in2}$, thereby obtaining five voltage levels in all from two adjacent reference voltages generated by the resistor string in the voltage generator 101. By adding only one capacitor and two switches to the circuit configuration of the first embodiment and modifying the switch control scheme, the second embodiment doubles the number of output voltage levels.

Third Embodiment

Figure 4:
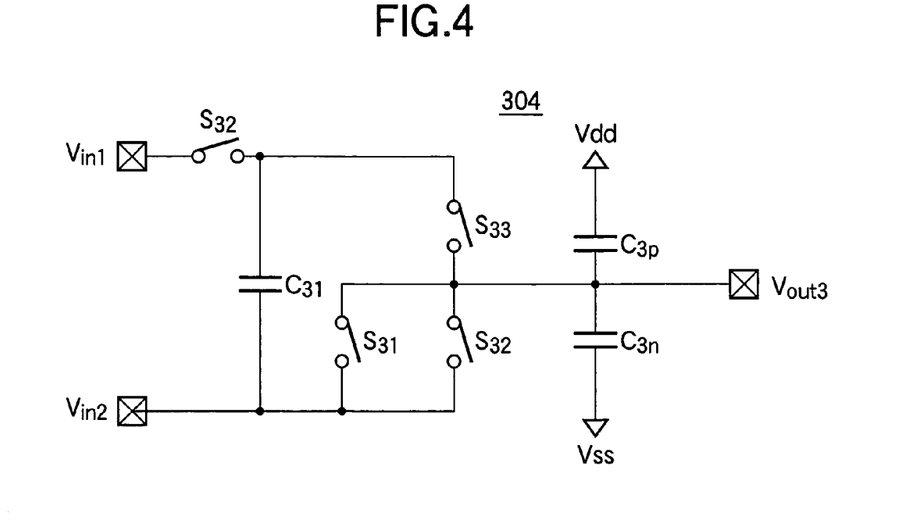
FIG. 4 is a circuit diagram of a D/A converter illustrating a third embodiment.

The third embodiment is an n-bit D/A converter having the voltage generator 101, first control circuit 102, and second control circuit 103 shown in FIG. 1, the switching circuit 105 shown in FIG. 2, and the third control circuit 304 shown in FIG. 4.

As in the first embodiment, the third control circuit 304 has first and second inputs $V_{in1}$ and $V_{in2}$ and a third output $V_{out3}$. The second input $V_{in2}$ is connected to the third output $V_{out3}$ through a first switch $S_{31}$. A pair of second switches $S_{32}$ are provided, one connecting the second input $V_{in2}$ to the third output $V_{out3}$ in parallel with the first switch $S_{31}$, the other connecting the first input $V_{in1}$ to the first terminal of a first capacitor $C_{31}$. The first terminal of the first capacitor $C_{31}$ is also connected through a third switch $S_{33}$ to the third output $V_{out3}$. The second terminal of the first capacitor $C_{31}$ is connected to the second input $V_{in2}$. Second and third capacitors $C_{3p}$, $C_{3n}$ are connected between the third output $V_{out3}$ and a power supply (Vdd) and between the third output $V_{out3}$ and ground (Vss), respectively.

The capacitance of the first capacitor is equal to the sum of the capacitances of the second and third capacitors ($C_{31}=C_{3p}+C_{3n}$). All of the switches $S_{31}$, $S_{32}$, $S_{33}$ are controlled by the least significant bit 1D and its complementary value 1DB (not shown).

Next, the operation of the third control circuit 304 will be described.

When 1D=0, the first switch $S_{31}$ is turned on and the second and third switches $S_{32}$, $S_{33}$ are turned off, so the second input $V_{in2}$ is output directly as the third output $V_{out3}$.

When 1D=1, the first and third switches $S_{31}$, $S_{33}$ are turned off and the second switches $S_{32}$ are turned on, connecting the first capacitor $C_{31}$ to the first input $V_{in1}$ and the second and third capacitors $C_{3p}$, $C_{3n}$ to the second input $V_{in2}$ so that the first capacitor $C_{31}$ is charged to $(V_{in1}-V_{in2})$, the second capacitor $C_{3p}$ to $(Vdd-V_{in2})$, and the third capacitor $C_{3n}$ to $(V_{in2}-Vss)$. After a time sufficient for these capacitors to charge, the second switches $S_{32}$ are turned off and the third switch $S_{33}$ is turned on instead, whereby the charges stored in the first, second, and third capacitors $C_{31}$, $C_{3p}$, and $C_{3n}$ are redistributed among these three capacitors according to the law of conservation of charge. Consequently, from the condition that $C_{31}=C_{3p}+C_{3n}$, the third output $V_{out3}$ is given by the following equation.

$$V_{out3}=V_{in2}+(½)(V_{in1}-V_{in2})$$

The third output $V_{out3}$ is therefore a voltage halfway between the first and second inputs $V_{in1}$ and $V_{in2}$, as in the first embodiment.

The second and third capacitors $C_{3p}$, $C_{3n}$ in the third embodiment may be input capacitance components of a voltage follower amplifier (not shown) connected to the third output $V_{out3}$, in which case the third control circuit 304 provides the same function as the third control circuit 104 of the first embodiment with only one capacitor $C_{31}$ instead of two. Alternatively, the second and third capacitors $C_{3p}$, $C_{3n}$ may be physically present in the third control circuit 304, but their capacitance values may be reduced by an amount equivalent to the input capacitance of the amplifier, thereby reducing the capacitive loads on the first and second control circuits 102, 103 and improving the D/A conversion speed. In any case, the third control circuit 304 of the third embodiment uses fewer switches than the third control circuit 104 in the first embodiment and has a simpler structure and smaller size, although both embodiments convert the same number of input data bits.

The third embodiment can be modified by eliminating the second switch $S_{32}$ connected in parallel with the first switch $S_{31}$, and modifying the operation of the first switch $S_{31}$ so that when 1D=1, the first switch $S_{31}$ is turned on and off together with the remaining second switch $S_{32}$.

The third embodiment can also be modified by eliminating the second capacitor $C_{3p}$, in which case the remaining first and third capacitors should have equal capacitance values, or by eliminating the third capacitor $C_{3n}$, in which case the remaining first and second capacitors should have equal capacitance. More generally, the second and third capacitors $C_{3p}$, $C_{3n}$ may be replaced by a single capacitor connected between the third output $V_{out3}$ and any fixed potential.

Fourth Embodiment

Figure 5:
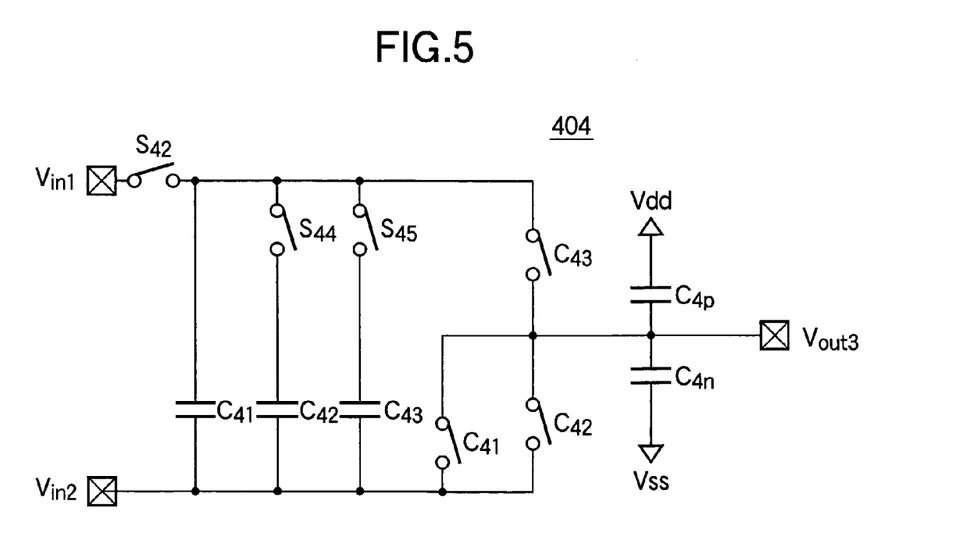
FIG. 5 is a circuit diagram of a D/A converter illustrating a fourth embodiment.

FIG. 5 illustrates a third control circuit 404 according to a fourth embodiment of the invention. The fourth embodiment is a modification of the third embodiment that operates as an (n+1)-bit D/A converter. The voltage generator 101, first control circuit 102, second control circuit 103 and switching circuit 105 are the same as in the first embodiment, as shown in FIGS. 1 and 2.

The third control circuit 404 in the fourth embodiment has first, second, and third switches $S_{41}$, $S_{42}$, $S_{43}$ and capacitors $C_{41}$, $C_{4n}$, $C_{4p}$ similar to the first, second, and third switches $S_{31}$, $S_{32}$, $S_{33}$ and capacitors $C_{31}$, $C_{3n}$, $C_{3p}$ of the third embodiment, with similar interconnections thereamong. In addition, the third control circuit 404 in the fourth embodiment has fourth and fifth capacitors $C_{44}$, $C_{45}$ and fourth and fifth switches $S_{44}$, $S_{45}$. The fourth switch $S_{44}$ and fourth capacitor $C_{44}$ are connected in series with each other and in parallel with the first capacitor $C_{41}$. Similarly, the fifth switch $S_{45}$ and fifth capacitor $C_{45}$ are connected in series with each other and in parallel with the first capacitor $C_{41}$. The first terminals of the first, fourth, and fifth capacitors $C_{41}$, $C_{4n}$, $C_{4p}$ are thus connected through switches to the first input $V_{in1}$, while the second terminals of these capacitors are connected in common to the second input $V_{in2}$.

The capacitance values of the first to fifth capacitors $C_{41}$, $C_{4p}$, $C_{4n}$, $C_{44}$, and $C_{45}$ in the third control circuit 404 in the fourth embodiment satisfy the following conditions:

$$3C_{41}=C_{4p}+C_{4n}$$

$$C_{44}=2C_{41}$$

$$C_{45}=6C_{41}$$

The switches $S_{41}$, $S_{42}$, $S_{43}$, $S_{44}$, and $S_{45}$ in the third control circuit 404 in the fourth embodiment are controlled by the two least significant bits 1D and 2D of the (n+1)-bit input data, and their complementary values 1DB and 2DB.

Next, the operation of the third control circuit 404 will be described.

When 2D=0 and 1D=0, the first switch $S_{41}$ is turned on and all the other switches are turned off, so the second input $V_{in2}$ is output directly as the third output $V_{out3}$.

When 2D=0 and 1D=1, the second switches $S_{42}$ are turned on and all the other switches are turned off, connecting the first capacitor $C_{41}$ to the first input $V_{in1}$ and the second and third capacitors $C_{4p}$, $C_{4n}$ to the second input $V_{in2}$ so that the first capacitor $C_{41}$ is charged to $(V_{in1}-V_{in2})$, the second capacitor $C_{4p}$ to $(Vdd-V_{in2})$, and the third capacitor $C_{4n}$ to $(V_{in2}-Vss)$. After a time sufficient for these capacitors to charge, the second switches $S_{42}$ are turned off and the third switch $S_{43}$ is turned on instead, whereby the charges stored in the first, second, and third capacitors $C_{41}$, $C_{4p}$, and $C_{4n}$ are redistributed among these three capacitors according to the law of conservation of charge. Consequently, from the condition that $3C_{41}=C_{4p}+C_{4n}$, the third output $V_{out3}$ is given by the following equation.

$$V_{out3}=V_{in2}+(¼)(V_{in1}-V_{in2})$$

The third output $V_{out3}$ is therefore higher than the second input voltage $V_{in2}$ by one quarter of the voltage difference between the first and second inputs $V_{in1}$, $V_{in2}$.

When 2D=1 and 1D=0, the second and fourth switches $S_{42}$, $S_{44}$ are turned on and all the other switches are turned off, causing the first and fourth capacitors $C_{41}$, $C_{44}$ to charge to $(V_{in1}-V_{in2})$, the second capacitor $C_{4p}$ to charge to $(Vdd-V_{in2})$, and the third capacitor $C_{4n}$ to charge to $(V_{in2}-Vss)$.

After a time sufficient for these capacitors to charge, the second switches $S_{42}$ are turned off and the third switch $S_{43}$ is turned on instead, whereby the charges stored in the first to fourth capacitors $C_{41}$, $C_{4p}$, $C_{4n}$, and $C_{44}$ are redistributed among these four capacitors according to the law of conservation of charge. Because $C_{41}+C_{44}=C_{4p}+C_{4n}$, the third output $V_{out3}$ is given by the following equation.

$$V_{out3}=V_{in2}+(1/2)(V_{in1}-V_{in2})$$

The third output $V_{out3}$ is therefore a voltage halfway between the first and second inputs $V_{in1}$, $V_{in2}$.

Finally, when 2D=1 and 1D=1, the second, fourth, and fifth switches $S_{42}$, $S_{44}$, and $S_{45}$ are turned on and the other switches are turned off, causing each of the first, fourth, and fifth capacitors $C_{41}$, $C_{44}$, and $C_{45}$ to charge to $(V_{in1}-V_{in2})$, the second capacitor $C_{4p}$ to charge to $(Vdd-V_{in2})$, and the third capacitor $C_{4n}$ to charge to $(V_{in2}-Vss)$. After a time sufficient for these capacitors to charge, the second switches $S_{42}$ are turned off and the third switch $S_{43}$ is turned on instead, whereby the charges stored in the first to fifth capacitors $C_{41}$, $C_{4p}$, $C_{4n}$, $C_{44}$, and $C_{45}$ are redistributed among these five capacitors according to the law of conservation of charge. Because $C_{41}+C_{44}+C_{45}=9C_{41}=3(C_{4p}+C_{4n})$, the third output $V_{out3}$ is given by the following equation.

$$V_{out3}=V_{in2}+(3/4)(V_{in1}-V_{in2})$$

The third output $V_{out3}$ is therefore higher than the second input voltage $V_{in2}$ by three-quarters of the voltage difference between the first and second inputs $V_{in1}$ and $V_{in2}$.

As in the third embodiment, the second and third capacitors $C_{4p}$, $C_{4n}$ may be input capacitance components of an amplifier (not shown) connected to the third output $V_{out3}$, or the capacitance values of the second and third capacitors $C_{4p}$, $C_{4n}$ may be reduced by an amount equivalent to the input capacitance of the amplifier.

The fourth embodiment can be modified to convert (n+m)-bit input data, where m is an integer greater than one, by adding further switches and capacitors in parallel with the fourth and fifth switches and capacitors.

Fifth Embodiment

Figure 6:
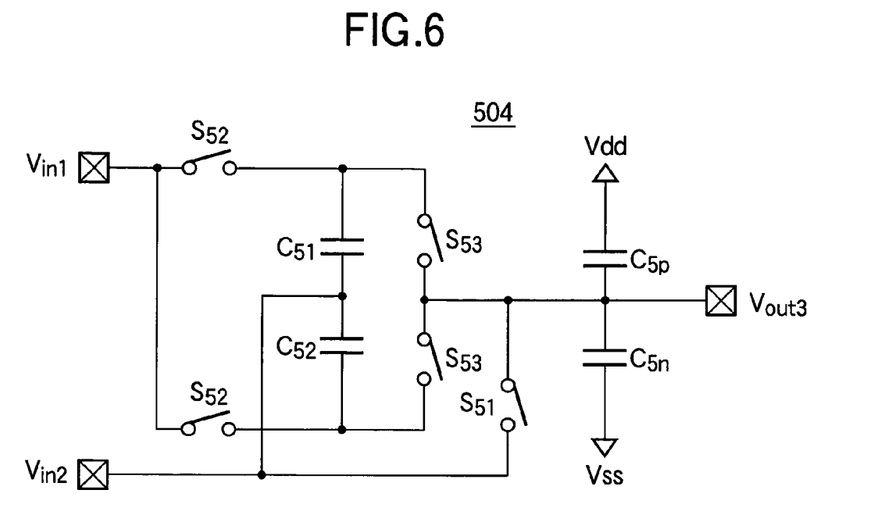
FIG. 6 is a circuit diagram of a D/A converter illustrating a fifth embodiment.

FIG. 6 illustrates a third control circuit 504 according to a fifth embodiment of the invention. The fifth embodiment has first, second, and third switches $S_{51}$, $S_{52}$, $S_{53}$ and first and second capacitors $C_{51}$, $C_{52}$ similar to the first, second, and third switches $S_{11}$, $S_{12}$, $S_{13}$ and first and second capacitors $C_{11}$, $C_{12}$ in the first embodiment, with similar interconnections, except that the second capacitor $C_{52}$ is connected through the lower second switch $S_{52}$ to the first input $V_{in1}$ instead of the second input $V_{in2}$. In addition, the fifth embodiment has third and fourth capacitors $C_{5p}$, $C_{5n}$ connected to the third output $V_{out3}$, similar to the second and third capacitors $C_{3p}$, $C_{3n}$ in the third embodiment, the fourth capacitor $C_{5p}$ being connected between the third output $V_{out3}$ and the power supply Vdd, the fifth capacitor $C_{5n}$ being connected between the third output $V_{out3}$ and ground Vss.

Alternatively, the fifth embodiment can be derived from the circuit structure of the third embodiment by adding the second capacitor $C_{52}$ and the switches $S_{52}$, $S_{53}$ that connect it to the first input $V_{in1}$ and third output $V_{out3}$.

The fifth embodiment also includes a voltage generator 101, first control circuit 102, second control circuit 103 and switching circuit 105 as shown in FIGS. 1 and 2.

The capacitors $C_{51}$, $C_{52}$, $C_{5p}$, and $C_{5n}$ in the third control circuit 504 of the fifth embodiment all have equal capacitance values. The first and third capacitors $C_{51}$, $C_{5p}$ are structured as p-channel MOS (PMOS) transistors, the capacitance being provided by the transistor gate capacitance. The second and fourth capacitors $C_{52}$, $C_{5n}$ are structured as n-channel MOS (NMOS) transistors, the capacitance being provided by the transistor gate capacitance.

Like the first embodiment, the fifth embodiment operates as an n-bit D/A converter. The switches $S_{51}$, $S_{52}$, and $S_{53}$ in the third control circuit 504 are controlled by the least significant bit 1D and its complementary value 1DB (not shown).

Next, the operation of the third control circuit 504 will be described.

When 1D=0, the first switch $S_{51}$ is turned on and the second and third switches $S_{52}$, $S_{53}$ are turned off, so the second input $V_{in2}$ is output directly as the third output $V_{out3}$.

When 1D=1, the first and second switches $S_{51}$, $S_{52}$ are turned on and the third switches $S_{53}$ are turned off, causing both the first and second capacitors $C_{51}$, $C_{52}$ to charge to $(V_{in1}-V_{in2})$, the third capacitor $C_{5p}$ to charge to $(Vdd-V_{in2})$, and the fourth capacitor $C_{5n}$ to charge to $(V_{in2}-Vss)$. After a time sufficient for these capacitors to charge, the first and second switches $S_{51}$, $S_{52}$ are turned off and the third switches $S_{53}$ are turned on instead, whereby the charges stored in the first to fourth capacitors $C_{51}$, $C_{52}$, $C_{5p}$, and $C_{5n}$ are redistributed among them according to the law of conservation of charge. Since all the capacitors have identical capacitance values as noted above, the third output $V_{out3}$ is given by the following equation.

$$V_{out3}=V_{in2}+(1/2)(V_{in1}-V_{in2})$$

The third output $V_{out3}$ is therefore a voltage halfway between the first and second inputs $V_{in1}$ and $V_{in2}$.

Since all the capacitors in the third control circuit 504 of the fifth embodiment are formed by the gate capacitances of MOS transistors and the third output $V_{out3}$ is determined by the ratios of these capacitances, process variations that cause a difference between the gate capacitances of PMOS and NMOS transistors affect the third output $V_{out3}$, but the third control circuit 504 is structured so that the effect of a capacitance difference between the first and second capacitors $C_{51}$ and $C_{52}$ is canceled by the similar difference between the capacitance of the third and fourth capacitors $C_{5p}$ and $C_{5n}$. The third output $V_{out3}$ therefore has higher precision than in the first to fourth embodiments. Furthermore, the gate capacitance of a MOS transistor is comparatively small, so the capacitors in the fifth embodiment can be charged and discharged rapidly, resulting in high-speed D/A conversion.

Sixth Embodiment

Figure 7:
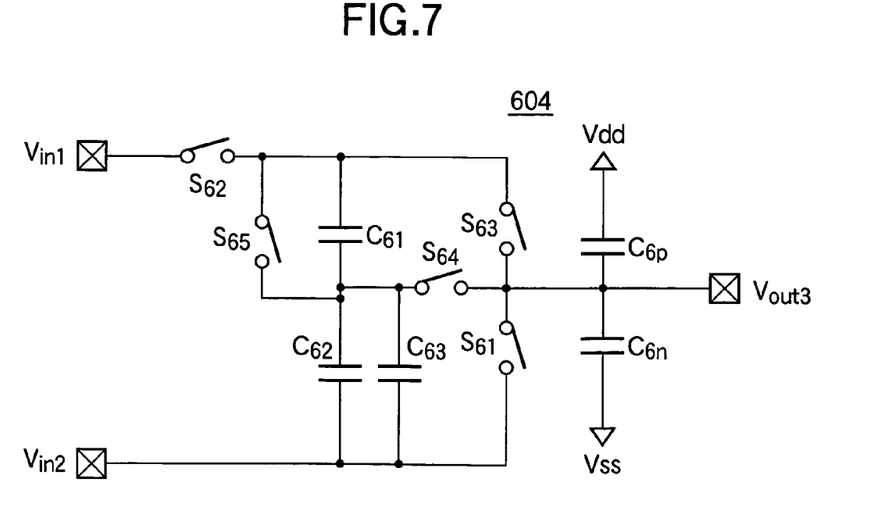
FIG. 7 is a circuit diagram of a D/A converter illustrating a sixth embodiment.

FIG. 7 illustrates a third control circuit 604 according to a sixth embodiment of the invention. The sixth embodiment is a modification of the fifth embodiment that operates as an (n+1)-bit D/A converter: in the example shown in FIG. 7, as a four-bit D/A converter receiving data bits 1D–4D and their complementary values 1DB–4DB. The sixth embodiment also includes a voltage generator 101, first control circuit 102, second control circuit 103 and switching circuit 105 as shown in FIGS. 1 and 2.

The third control circuit 604 has first and second inputs $V_{in1}$, $V_{in2}$ and a third output $V_{out3}$ as in the first embodiment, and comprises first to fifth capacitors $C_{61}$, $C_{62}$, $C_{63}$, $C_{6p}$, and $C_{6n}$ and first to fifth switches $S_{61}$, $S_{62}$, $S_{63}$, $S_{64}$, and $S_{65}$. The first switch $S_{61}$ is connected between the second input $V_{in2}$ and third output $V_{out3}$. The second and third switches $S_{62}$ and $S_{63}$ are connected in series between the first input $V_{in1}$ and third output $V_{out3}$. The first to third capacitors $C_{61}$, $C_{62}$, and $C_{63}$ are connected between the second input $V_{in2}$ and a node disposed between the second and third switches $S_{62}$, $S_{63}$, the first and second capacitors $C_{61}$, $C_{62}$ being connected in series, the third capacitor $C_{63}$ being connected in parallel with the second capacitor $C_{62}$. The fourth switch $S_{64}$ is connected between the third output $V_{out3}$ and the node at which the first and second capacitors $C_{61}$, $C_{62}$ are interconnected. The fifth switch $S_{65}$ is connected in parallel with the first capacitor $C_{61}$. The fourth and fifth capacitors $C_{6p}$ and $C_{6n}$, are similar to the third and fourth capacitors $C_{5p}$, $C_{5n}$ in the fifth embodiment, the fourth capacitor $C_{6p}$ being connected between the third output $V_{out3}$ and power supply Vdd, the fifth capacitor $C_{6n}$ being connected between the third output $V_{out3}$ and ground Vss.

The capacitors $C_{61}$, $C_{62}$, $C_{63}$, $C_{6p}$, and $C_{6n}$ in the third control circuit 604 of the sixth embodiment are all formed by the gate capacitances of MOS transistors and have equal capacitance values. The first and fourth capacitors $C_{61}$, $C_{6p}$ are formed by the gate capacitances of PMOS transistors, whereas the second, third, and fifth capacitors $C_{62}$, $C_{63}$, and $C_{6n}$ are formed by the gate capacitances of NMOS transistors. The switches $S_{61}$, $S_{62}$, $S_{63}$, $S_{64}$, and $S_{65}$ are controlled by the two least significant bits 1D and 2D and their complementary values 1DB and 2DB.

Next, the operation of the third control circuit 604 will be described.

When 2D=0 and 1D=0, the first switch $S_{61}$ is turned on and all the other switches are turned off, so the second input $V_{in2}$ is output directly as the third output $V_{out3}$.

When 2D=0 and 1D=1, the first and second switches $S_{61}$, $S_{62}$ are turned on and all the other switches are turned off, causing the capacitor circuit comprising the first to third capacitors $C_{61}$, $C_{62}$, and $C_{63}$ to charge to a total voltage of $(V_{in1}-V_{in2})$, the fourth capacitor $C_{6p}$ to charge to (Vdd–$V_{in2}$), and the fifth capacitor $C_{6n}$ to charge to ($V_{in2}$–Vss). After a time sufficient for the capacitors to charge, the first and second switches $S_{61}$, $S_{62}$ are turned off and the third switch $S_{63}$ is turned on instead, whereby the charges stored in the first to fifth capacitors $C_{61}$, $C_{62}$, $C_{63}$, $C_{6p}$, and $C_{6n}$ are redistributed among these five capacitors according to the law of conservation of charge. Since all the capacitors have identical capacitance values as noted above, the third output $V_{out3}$ is given by the following equation.

$$V_{out3}=V_{in2}+(1/4)(V_{in1}-V_{in2})$$

The third output $V_{out3}$ is a voltage higher than the second input voltage $V_{in2}$ by one quarter of the voltage difference between the first and second inputs $V_{in1}$ and $V_{in2}$.

When 2D=1 and 1D=0, the first, second, and fifth switches $S_{61}$, $S_{62}$, and $S_{65}$ are turned on and the other switches are turned off, causing both the second and third capacitors $C_{62}$ and $C_{63}$ to charge to $(V_{in1}-V_{in2})$, the fourth capacitor $C_{6p}$ to charge to (Vdd–$V_{in2}$), and the fifth capacitor $C_{6n}$ to charge to ($V_{in2}$–Vss) while the first capacitor $C_{61}$ discharges to zero volts. After a time sufficient for these capacitors to charge and discharge, the first, second, and fifth switches $S_{61}$, $S_{62}$, and $S_{65}$ are turned off and the third and fourth switches $S_{63}$ and $S_{64}$ are turned on instead, whereby the first capacitor $C_{61}$ remains discharged to zero volts and the charge stored in the second to fifth capacitors $C_{62}$, $C_{63}$, $C_{6p}$, and $C_{6n}$ is redistributed among these four capacitors according to the law of conservation of charge. Since the four capacitors have identical capacitance values, the third output $V_{out3}$ is given by the following equation.

$$V_{out3}=V_{in2}+(1/2)(V_{in1}-V_{in2})$$

The third output $V_{out3}$ is a voltage halfway between the first and second inputs $V_{in1}$ and $V_{in2}$.

Finally, when 2D=1 and 1D=1, the first, second, and fifth switches $S_{61}$, $S_{62}$, and $S_{65}$ are turned on and the other switches are turned off, causing both the second and third capacitors $C_{62}$ and $C_{63}$ to charge to $(V_{in1}-V_{in2})$, fourth capacitor $C_{6p}$ to (Vdd–$V_{in2}$), and fifth capacitor $C_{6n}$ to ($V_{in2}$–Vss). After a time sufficient for these capacitors to charge, the first, second, and fifth switches $S_{61}$, $S_{62}$, and $S^{65}$ are turned off and only the third switch $S_{63}$ is turned on instead, whereby the charge stored in the second to fifth capacitors $C_{62}$, $C_{63}$, $C_{6p}$, and $C_{6n}$ is redistributed among all five capacitors, including the first capacitor $C_{61}$, according to the law of conservation of charge. Since all the capacitors have identical capacitance values, the third output $V_{out3}$ is given by the following equation.

$$V_{out3}=V_{in2}+(3/4)(V_{in1}-V_{in2})$$

The third output $V_{out3}$ is a voltage higher than the second input voltage $V_{in2}$ by three-quarters of the voltage difference between the first and second inputs $V_{in1}$ and $V_{in2}$.

All the capacitors in the third control circuit 604 of the sixth embodiment are formed by the gate capacitances of MOS transistors and the third output $V_{out3}$ is determined by the ratios of these capacitors. Like the third control circuit 504 in the fifth embodiment, third control circuit 604 of the sixth embodiment is structured so that variations in capacitance values caused by process variations cancel out and the third output $V_{out3}$ has higher precision than in the first to fourth embodiments, and the relatively small gate capacitance of an MOS transistor means that the first to fifth capacitors can be charged and discharged rapidly, resulting in high-speed D/A conversion.

The second and third capacitors $C_{62}$, $C_{63}$ can be replaced by a single capacitor having twice the capacitance of the first capacitor $C_{61}$.

Those skilled in the art will recognize that further variations in the preceding embodiments are possible within the scope of the invention, which is defined in the appended claims.

What is claimed is:
1. A digital-to-analog (D/A) converter comprising:
   a voltage generator generating a plurality of reference voltages forming a monotonic sequence of voltage levels;
   a first control circuit for selecting an arbitrary one of the plurality of reference voltages as a first output;
   a second control circuit for selecting another one of the plurality of reference voltages, adjacent in the monotonic sequence to the one of the plurality of reference voltages selected by the first control circuit, as a second output; and
   a third control circuit for generating a third output from the first output and the second output, the third control circuit having a plurality of capacitors and a switching network for charging at least one of the capacitors to a voltage difference between the first output and the second output, then redistributing charge among the capacitors to generate an intermediate voltage intermediate between the first output and the second output, and selectively supplying one of the first output, the second output, and the intermediate voltage as the third output.

2. The D/A converter of claim 1, wherein:
the monotonic sequence of voltage levels is numbered by consecutive integers;
the first output is an even-numbered voltage level; and
the second output is an odd-numbered voltage level.

3. The D/A converter of claim 1, wherein the third control circuit has a first input terminal receiving one of the first output and the second output, a second input terminal receiving another one of the first output and the second output, and an output terminal from which the third output is produced.

4. The D/A converter of claim 3, further comprising a switching circuit for interchanging connections of the first and second outputs to the first and second input terminals.

5. The D/A converter of claim 3, wherein:
the plurality of capacitors includes a first capacitor and a second capacitor both having one terminal connected to the second input terminal; and
the switching network includes switches for connecting another terminal of the first capacitor switchably to the first input terminal and the output terminal, and for connecting another terminal of the second capacitor switchably to the second input terminal and the output terminal.

6. The D/A converter of claim 5, wherein the switching network also includes a switch for connecting the second input terminal switchably to the output terminal.

7. The D/A converter of claim 5, wherein the first capacitor and the second capacitor have equal capacitance values.

8. The D/A converter of claim 5, wherein:
the plurality of capacitors also includes a third capacitor having one terminal connected to the second input terminal; and
the switching network includes further switches for connecting another terminal of the third capacitor switchably to said another terminal of the first capacitor and said another terminal of the second capacitor.

9. The D/A converter of claim 3, wherein:
the plurality of capacitors in the third control circuit includes
a first capacitor having one terminal connected to the second input terminal, and
a second capacitor having one terminal connected to a fixed potential and another terminal connected to the output terminal; and
the switching network has switches for connecting another terminal of the first capacitor switchably to the first input terminal and the output terminal, and for connecting the second input terminal switchably to the output terminal.

10. The D/A converter of claim 9, wherein the output terminal is connected to a device having an input capacitance forming at least part of the second capacitor.

11. The D/A converter of claim 10, wherein said device is an amplifier.

12. The D/A converter of claim 9, wherein the fixed potential is a first power supply potential, and the plurality of capacitors also includes a third capacitor having one terminal connected to a second power supply potential and another terminal connected to the output terminal.

13. The D/A converter of claim 12, wherein the output terminal is connected to a device having an input capacitance forming at least part of the second capacitor and the third capacitor.

14. The D/A converter of claim 12, wherein the first capacitor has a capacitance equal to a sum of the capacitances of the second capacitor and the third capacitor.

15. The D/A converter of claim 12, wherein:
the plurality of capacitors also includes a fourth capacitor having one terminal connected to the second input terminal; and
the switching network includes further switches for switchably connecting another terminal of the fourth capacitor to the first input terminal and the output terminal.

16. The D/A converter of claim 15, wherein the first capacitor, the second capacitor, the third capacitor, and the fourth capacitor have mutually equal capacitance values.

17. The D/A converter of claim 9, wherein the third control circuit also has a first parallel capacitor and a second parallel capacitor connected in parallel with the first capacitor through respective switches in the switching network.

18. The D/A converter of claim 17, wherein the first capacitor, the first parallel capacitor, and the second parallel capacitor have mutual capacitance ratios of 1:2:6.

19. The D/A converter of claim 3, wherein:
the plurality of capacitors includes
a first capacitor,
a second capacitor having one terminal connected to one terminal of the first capacitor and another terminal connected to the second input terminal,
a third capacitor having one terminal connected to a first power supply potential and another terminal connected to the output terminal, and
a fourth capacitor having one terminal connected to a second power supply potential and another terminal connected to the output terminal; and
the switching network includes
a first switch switchably connecting the second input terminal to the output terminal,
a second switch switchably connecting another terminal of the first capacitor to the first input terminal,
a third switch switchably connecting said another terminal of the first capacitor to the output terminal,
a fourth switch switchably connecting said one terminal of the first capacitor to the output terminal, and
a fifth switch connected in parallel with the first capacitor.

20. The D/A converter of claim 19, wherein the second capacitor comprises a pair of unit capacitors connected in parallel.

21. The D/A converter of claim 19, wherein the first capacitor, the third capacitor, the fourth capacitor, and the pair of unit capacitors have mutually equal capacitance values.

22. The D/A converter of claim 1, wherein the plurality of capacitors are gate capacitances of metal-oxide-semiconductor (MOS) transistors.

23. The D/A converter of claim 22, wherein the MOS transistors include both a p-channel transistor and an n-channel transistor.

24. The D/A converter of claim 1, wherein the number of reference voltages is $2^n+1$, and by switchably dividing a difference between the two selected reference voltages into $2^m$ equal parts, the D/A converter generates $2^{m+n}$ voltage gradations at the third output, m and n being positive integers.

25. The D/A converter of claim 24, wherein m equals one.

26. The D/A converter of claim 24, wherein m equals two.

* * * * *